(12) United States Patent
Ohta

(10) Patent No.: US 6,341,651 B1
(45) Date of Patent: Jan. 29, 2002

(54) HEAT SINK AND METHOD OF FABRICATING SAME

(75) Inventor: Keiichiro Ohta, Oyama (JP)

(73) Assignee: Showa Denko K.K., Toyko (JP)

(*) Notice: Subject to any disclaimer, the term of this patent is extended or adjusted under 35 U.S.C. 154(b) by 0 days.

(21) Appl. No.: 09/715,095

(22) Filed: Nov. 20, 2000

(30) Foreign Application Priority Data

Nov. 26, 1999 (JP) .......................................... 11-335980

(51) Int. Cl.[7] ................................................. H05K 7/20
(52) U.S. Cl. ...................... 165/185; 165/181; 29/890.03
(58) Field of Search ................................ 165/181, 185; 29/890.03

(56) References Cited

U.S. PATENT DOCUMENTS

| | | | | |
|---|---|---|---|---|
| 3,722,073 A | * | 3/1973 | Larson, Jr. ................. | 29/472.3 |
| 4,369,838 A | * | 1/1983 | Asanuma et al. ............ | 165/185 |
| 5,158,029 A | * | 10/1992 | Hirose ........................ | 112/230 |
| 5,260,142 A | * | 11/1993 | Kawabe et al. ............. | 428/654 |
| 5,304,262 A | * | 4/1994 | Karaoke et al. ............ | 148/589 |
| 5,541,797 A | * | 7/1996 | Ping et al. .................. | 360/132 |

* cited by examiner

Primary Examiner—Allen Flanigan
(74) Attorney, Agent, or Firm—Armstrong, Westerman, Hattori, McLeland & Naughton, LLP

(57) ABSTRACT

In fabricating a heat sink from a blank comprising a base plate portion, and a fin-forming portion to be cut and provided on at least one side of the base plate portion by cutting the fin-forming portion to a raised form to make a plurality of fins, an object of the invention is to reduce the likelihood of producing burrs which are difficult to remove when the base plate portion is drilled while assuring the base plate portion of suitable machinability to render the heat sink less costly to manufacture.

In a heat sink 1 having a plurality of fins 3 and fabricated from a blank 11 comprising a base plate portion 12, and a fin-forming portion 13 to be cut and provided on at least one side of the base plate portion 12 by cutting the fin-forming portion 13 to a raised form to make the fins 3, the above object can be fulfilled by using as the heat sink blank 11 an aluminum or aluminum alloy extrudate having a Vickers hardness of 40 to 65.

2 Claims, 2 Drawing Sheets

ID OF THE INVENTION

The present invention relates to heat sinks and a method of fabricating the heat sink.

Heat sinks are generally used in recent years as devices for dissipating the heat released by heat-generating electronic components, such as semiconductors, incorporated in electronic devices, into the atmosphere outside the device.

Such heat sinks already known comprise a base plate, and a plurality of fins formed on at least one surface of the base plate by cutting to a raised form. In fabricating the heat sink from a blank comprising a base plate portion, and a fin-forming portion to be cut and formed on at least one side of the base plate portion, the fin-forming portion of the blank is cut to a raised form to make the fins. Bolt holes or screw holes are also formed in the base plate portion for use in attaching the heat sink to an electronic device or the like.

Heat sink blanks usually used are aluminum or aluminum alloy extrudates. The hardness of the blank is so determined that the fin-forming portion can be cut to the raised form smoothly with a diminished load. However, when the blank has such hardness, drilling the bolt holes or screw holes in the blank base plate portion is liable to produce burrs. If left as it is, the burr is likely to become removed, possibly shorting the electronic circuit, hence an invariable need for removal, whereas the deburring work entails an increased cost.

SUMMARY OF THE INVENTION

In fabricating a heat sink from a blank comprising a base plate portion, and a fin-forming portion to be cut and provided on at least one side of the base plate portion by cutting the fin-forming portion to a raised form to make a plurality of fins, an object of the present invention is to reduce the likelihood of producing burrs which are difficult to remove when the base plate portion is drilled while assuring the base plate portion of suitable machinability to render the heat sink less costly to manufacture.

The present invention provides a heat sink having a plurality of fins and fabricated from a blank comprising a base plate portion, and a fin-forming portion to be cut and provided on at least one side of the base plate portion by cutting the fin-forming portion to a raised form to make the fins, the heat sink being characterized in that the heat sink blank comprises an aluminum or aluminum alloy extrudate having a Vickers hardness of 40 to 65. The hardness of the blank is adjusted usually by an aging treatment after extrusion, i.e., by holding the extrudate as prepared at a predetermined temperature for a specified period of time.

FIG. 4 shows the relationships of the hardness (Vickers hardness) of the heat sink blank with the machinability of the blank (ease of cutting of the fin-forming portion) and with the properties of burrs produced. FIG. 4 indicates the machinability by a broken line (A), the properties of burrs by a chain line (B) and the sum of the two items by a solid line (A)+(B). FIG. 4 reveals that both the machinability and the properties of burrs produced are in a suitable range when the hardness Hv of the heat sink blank is in the range of 40 to 65. With the heat sink of the present invention, the blank can be easily cut to form the raised fins and drilled without producing burrs having such properties that they require removal work or are difficult to remove, whereby a rise in manufacturing cost can be suppressed.

The extrudate for use in fabricating the heat sink of the invention preferably has an aluminum alloy composition comprising 0.2 to 0.6 wt. % of Si, 0.45 to 0.9 wt. % of Mg, and the balance Al and inevitable impurities.

If the Si content is less than 0.2 wt. % and the Mg content, less than 0.45 wt. %, the extrudate fails to have sufficient strength as the material, whereas if the Si content is over 0.6 wt. %, with the Mg content in excess of 0.9 wt. %, reduced productivity will result due to an increased load involved in extrusion. Further if in an amount of more than 0.9 wt. %, Mg forms a solid solution in aluminum, causing the distortion of the lattice structure of aluminum and impeding the passage of free electrons to result in lower thermal conductivity.

The present invention also provides a method of fabricating the heat sink described above which method is characterized in that a fin-forming portion of a heat sink blank comprising an aluminum or aluminum alloy extrudate is cut in the same direction as the direction of extrusion of the extrudate to a raised form to thereby make a plurality of fins.

When the fin-forming portion is thus cut in the same direction as the direction of extrusion of the extrudate to the raised form, variations are less likely to occur in the height of the resulting fins.

DESCRIPTION OF THE PREFERRED EMBODIMENTS

Figure 1:
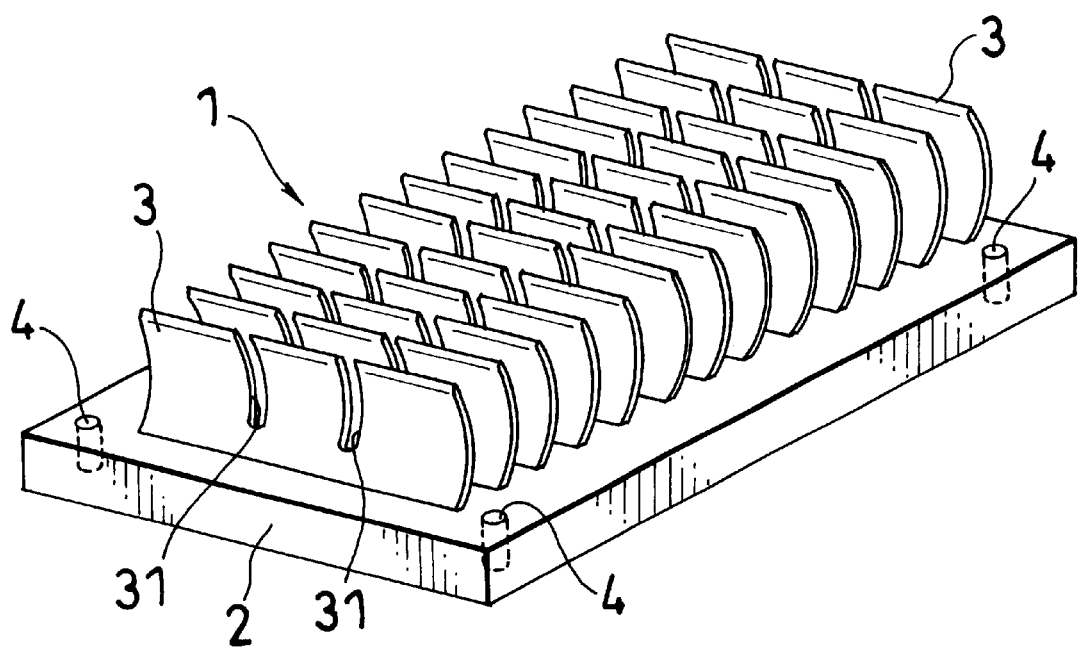
FIG. 1 is a perspective view of a heat sink embodying the invention.
Figure 2:
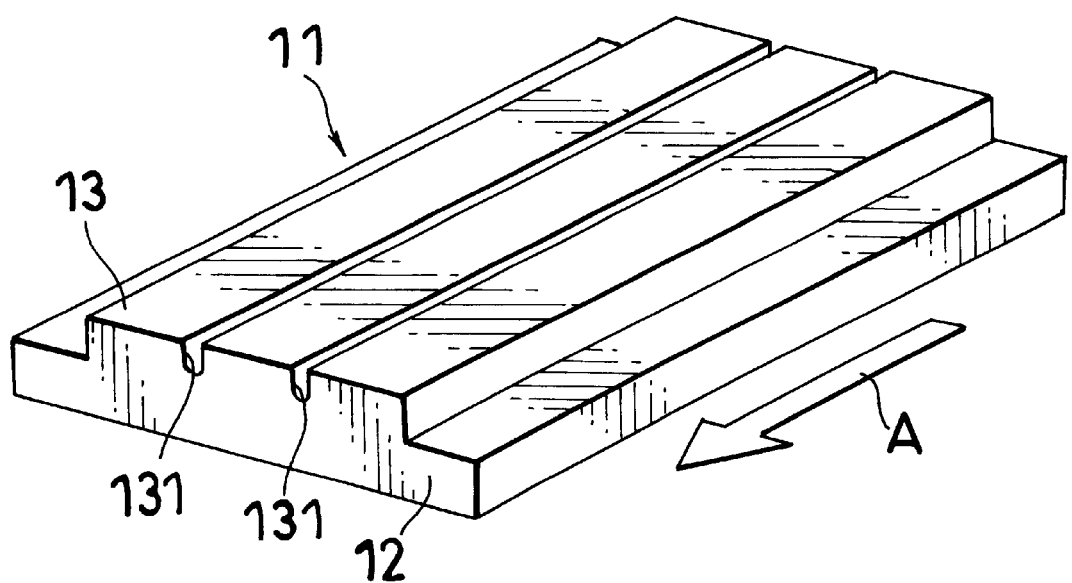
FIG. 2 illustrates a step included in the method of fabricating the heat sink of the invention and is a perspective view showing the heat sink blank to be used.
Figure 3:
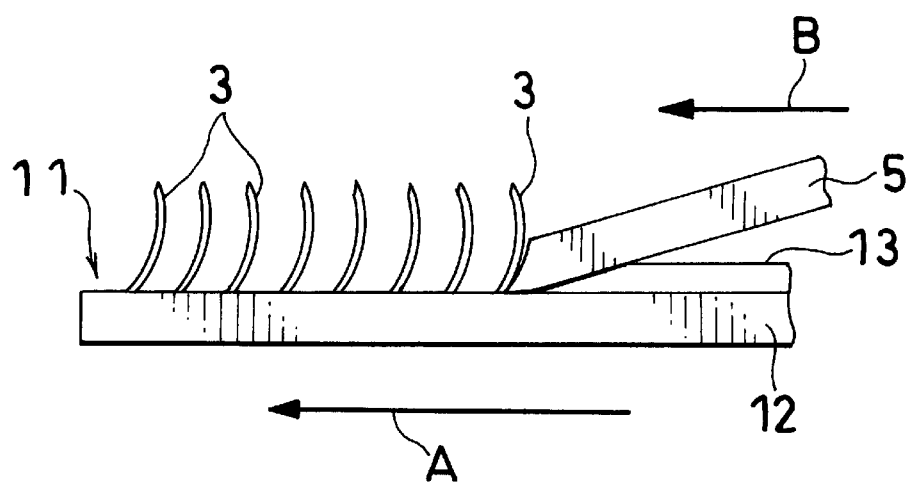
FIG. 3 is a side elevation showing another step included in the method of fabrication, i.e., the step of cutting a fin-forming portion of the he at sink blank to a raised form.
Figure 4:
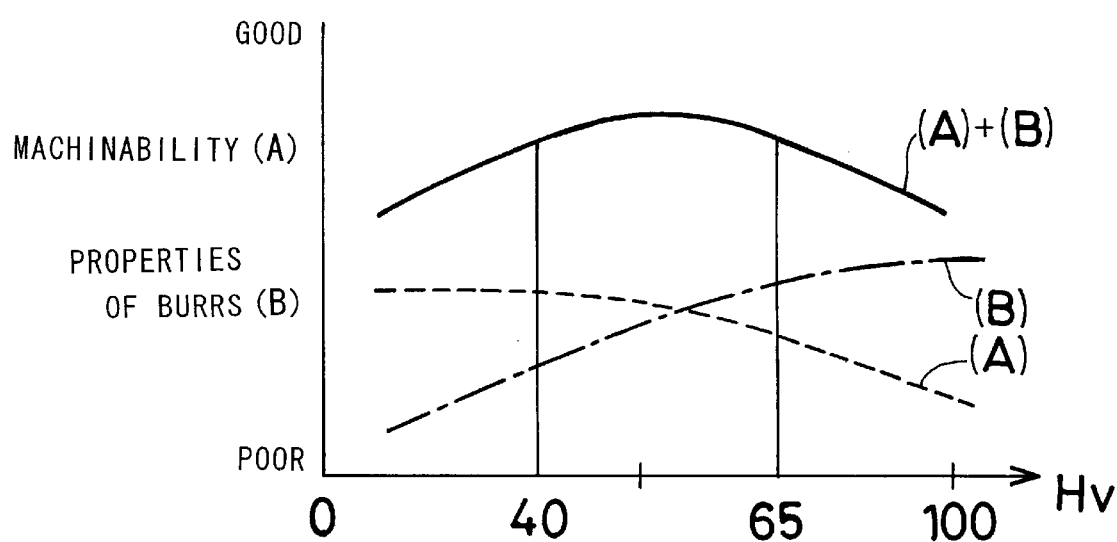
FIG. 4 is a diagram showing the relationships of the hardness of the heat sink blank with the machinability of the blank and the properties of burrs produced.

FIGS. 1 to 3 show an embodiment of the present invention.

With reference to FIG. 1 showing a heat sink of the invention, the heat sink 1 comprises a base plate 2, and a plurality of parallel fins 3 formed on the upper surface of the base plate 2 except the peripheral portion thereof. Each fin 3 is in the form of a circular-arc plate elongated transversely of the base plate 2 and slightly bulging rearward in cross section. The fin 3 has two slits 31 extending vertically from its upper edge as if dividing the fin into three portions as arranged transversely of the base plate 2. A bolt hole 4 is formed in each of the four corners of the base plate 2 for inserting a bolt therethrough to attach the heat sink 1 to an electronic component.

Next, a method of fabricating the heat sink 1 will be described with reference to FIGS. 2 and 3.

Prepared first is a heat sink blank 11 as shown in FIG. 2. The blank 11 comprises a base plate portion 12, and a fin-forming portion 13 to be cut and provided on the upper side of the base plate portion 12. The fin-forming portion 13 has a slightly smaller width than the base plate portion 12 and two grooves 131 spaced apart by a predetermined distance and extending longitudinally of the base plate portion 12. These grooves 131 serve to form the slits 31 in the fins 3 to be obtained. The grooves 131 also serve to hold therein the cutting oil to be supplied when the fin-forming portion 13 is cut to a raised form as will be described below, whereby the portion 13 can be cut smoothly. The heat sink blank 11 is made of an aluminum alloy extrudate having a Vickers hardness Hv of 50 and comprising 0.6 wt. % of Si, 0.5 wt. % of Mg, and the balance Al and inevitable impurities. The hardness was adjusted by aging the extrudate (at 230° C. for 5 hours) after the extrusion. The arrow A shown in FIG. 2 indicates the direction of extrusion.

The fin-forming portion 13 of the blank 11 is then cut to a raised form by using a cutting tool 5 or the like as shown in FIG. 3, whereby the fins 3 are formed. The portion 13 is cut in the same direction B as the direction of extrusion A. The fins 3 can be formed by this step very smoothly with high precision because the heat sink blank 11 is made of an aluminum alloy extrudate having the foregoing hardness and composition and also because the fin-forming portion 13 is cut toward the same direction B as the extrusion direction A.

Finally, the base plate portion 12 of the blank 11 is drilled at its four corners as by a drill or press machine to form the bolt holes 4 (see FIG. 1). The inner peripheries of the base plate portion 12 which define the bolt holes 4 thus formed are free from burrs having such properties that they require deburring work or are difficult to remove since the aluminum alloy extrudate providing the blank 11 was adjusted to the aforementioned hardness.

What is claimed is:

1. A heat sink having a plurality of fins and fabricated from a blank comprising a base plate portion, and a fin-forming portion to be cut and provided on at least one side of the base plate portion by cutting the fin-forming portion to a raised form to make the fins, the heat sink being characterized in that the heat sink blank comprises an aluminum or aluminum alloy extrudate having a Vickers hardness of 40 to 65.

2. A heat sink according to claim 1 which is characterized in that the extrudate has an aluminum alloy composition comprising 0.2 to 0.6 wt. % of Si, 0.45 to 0.9 wt. % of Mg, and the balance Al and inevitable impurities.

* * * * *

UNITED STATES PATENT AND TRADEMARK OFFICE
CERTIFICATE OF CORRECTION

PATENT NO.   : 6,341,651 B1
DATED        : January 29, 2002
INVENTOR(S)  : Keiichiro Ohta It is certified that error appears in the above-identified patent and that said Letters Patent is hereby corrected as shown below:

<u>Column 4,</u>
Line 16, between "65" and the period, add:

-- , wherein the fin-forming portion of a heat sink blank is cut in the same direction as the direction as an extrusion direction of the extrudate to a raised form to thereby form a plurality of fins. --

Signed and Sealed this

Tenth Day of September, 2002

Attest:

Attesting Officer

JAMES E. ROGAN
*Director of the United States Patent and Trademark Office*